US007513686B2

(12) United States Patent  
Schaffer

(10) Patent No.: US 7,513,686 B2
(45) Date of Patent: Apr. 7, 2009

(54) CIRCUIT LID WITH A THERMOCOUPLE

(75) Inventor: Joseph M. Schaffer, Luling, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 468 days.

(21) Appl. No.: 11/362,749

(22) Filed: Feb. 27, 2006

(65) Prior Publication Data
US 2007/0200475 A1 Aug. 30, 2007

(51) Int. Cl.
    G01K 7/00 (2006.01)
(52) U.S. Cl. ........................ 374/180; 374/179
(58) Field of Classification Search ........... 374/180
    See application file for complete search history.

(56) References Cited
    U.S. PATENT DOCUMENTS
    6,967,363 B1  11/2005  Buller ............... 257/288

2002/0075937 A1*  6/2002  Yi et al. ............ 374/179
2005/0205959 A1*  9/2005  Chau et al. .......... 257/467

OTHER PUBLICATIONS

Paul Horowitz and Winfield Hill; Art of Electronics, Second Edition; 1989; pp. 988-992.

* cited by examiner

Primary Examiner—Gail Verbitsky
Assistant Examiner—Mirellys Jagan
(74) Attorney, Agent, or Firm—Timothy M. Honeycutt

(57) ABSTRACT

Various devices for measuring an electronic device lid are provided. In one aspect, an apparatus is provided that includes an integrated circuit, a lid for positioning on the integrated circuit, and a junction of two dissimilar metals associated with the lid. The junction provides a thermocouple to provide an output signal representative of a temperature of the lid.

36 Claims, 4 Drawing Sheets

CIRCUIT LID WITH A THERMOCOUPLE

BACKGROUND OF THE INVENTION

1. Field of the Invention

This invention relates generally to integrated circuits, and more particularly to integrated circuit thermal management systems.

2. Description of the Related Art

Many types of currently-available integrated circuits are mounted on a substrate, which is in turn affixed to a printed circuit board or other type of mounting structure. Following attachment to the printed circuit board, the integrated circuit is covered by a lid, which provides not only a protective covering for the integrated circuit but may also facilitate the transfer of heat from the integrated circuit to one sort of cooling structure or another. In the testing context, a thermal control system or "heater" is usually positioned on the lid. The heater is operable to maintain the temperature of the integrated circuit within some selected range while the integrated circuit is subjected to electrical and other types of performance testing. Such testing frequently subjects the integrated circuit to more rigorous conditions than would be encountered in actual circuit operation. Accordingly, the thermal control system is used to prevent the temperature of the integrated circuit from spiraling upward and causing chip failure.

Accurate knowledge of the thermal environment of an integrated circuit and its corresponding lid is important from both a testing and manufacturing standpoint. In this regard most present day integrated circuits include an onboard diode that serves as a temperature measuring device. Many conventional heaters also include an onboard thermal diode that is positioned on the upper surface of the heater. Of course, the difficulty with the conventional set up is that while the onboard diode on the integrated circuit provides a relatively good measure of the temperature of the integrated circuit and while the onboard thermal diode on the thermal control system provides a similarly acceptable measurement of the temperature of the thermal control system, neither provides an acceptably accurate measure of the temperature of the lid. Interestingly though, the temperature of the lid is often used by electronics manufacturers as a specification for the desired thermal performance of the electronic system in question.

One conventional technique for measuring lid temperature involves using a sensing probe, such as a Type-T thermocouple, in conjunction with a Kryotech-brand heater. The thermocouple is brought into contact with the lid. This technique has the drawback of requiring clear access to the lid, which is usually not feasible if a heater with a complete surface contact is present. Attempts to provide better access for the probe may actually increase the thermal resistance of the heat transfer pathway between the integrated circuit and the heater.

More remote sensing techniques, such as infrared sensing, again rely on a clear pathway between the lid and the remote sensor. Attempts to provide access to the lid for either a contact probe or a remote temperature sensor run the risk of increasing thermal resistance and thus significantly decreasing the ability to control the heating levels of the integrated circuit.

The present invention is directed to overcoming or reducing the effects of one or more of the foregoing disadvantages.

SUMMARY OF THE INVENTION

In accordance with one aspect of the present invention, an apparatus is provided that includes an electronic device, a lid for positioning on the electronic device, and a junction of two dissimilar metals associated with the lid. The junction provides a thermocouple to provide an output signal representative of a temperature of the lid.

In accordance with another aspect of the present invention, an apparatus is provided that includes an integrated circuit, a lid for positioning on the integrated circuit, and a junction of two dissimilar metals associated with the lid. The junction provides a thermocouple to provide an output signal representative of a temperature of the lid.

In accordance with another aspect of the present invention, an apparatus is provided that includes a lid for an integrated circuit and a junction of two dissimilar metals associated with the lid. The junction provides a thermocouple to provide an output signal representative of a temperature of the lid.

In accordance with another aspect of the present invention, an apparatus is provided that includes an electronic device, a lid for positioning on the electronic device, and a junction of two dissimilar metals associated with the lid. The junction provides a thermocouple to provide an output signal representative of a temperature of the lid. A heat sink is coupled to the lid.

In accordance with another aspect of the present invention, a method of sensing a temperature of an integrated circuit lid is provided. A junction of two dissimilar metals is formed in association with the lid to provide a thermocouple operable to provide a first output signal indicative of the temperature of the lid. The junction is coupled to a sensing instrument to receive the first output signal and generate a second output signal indicative of the temperature of the lid.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
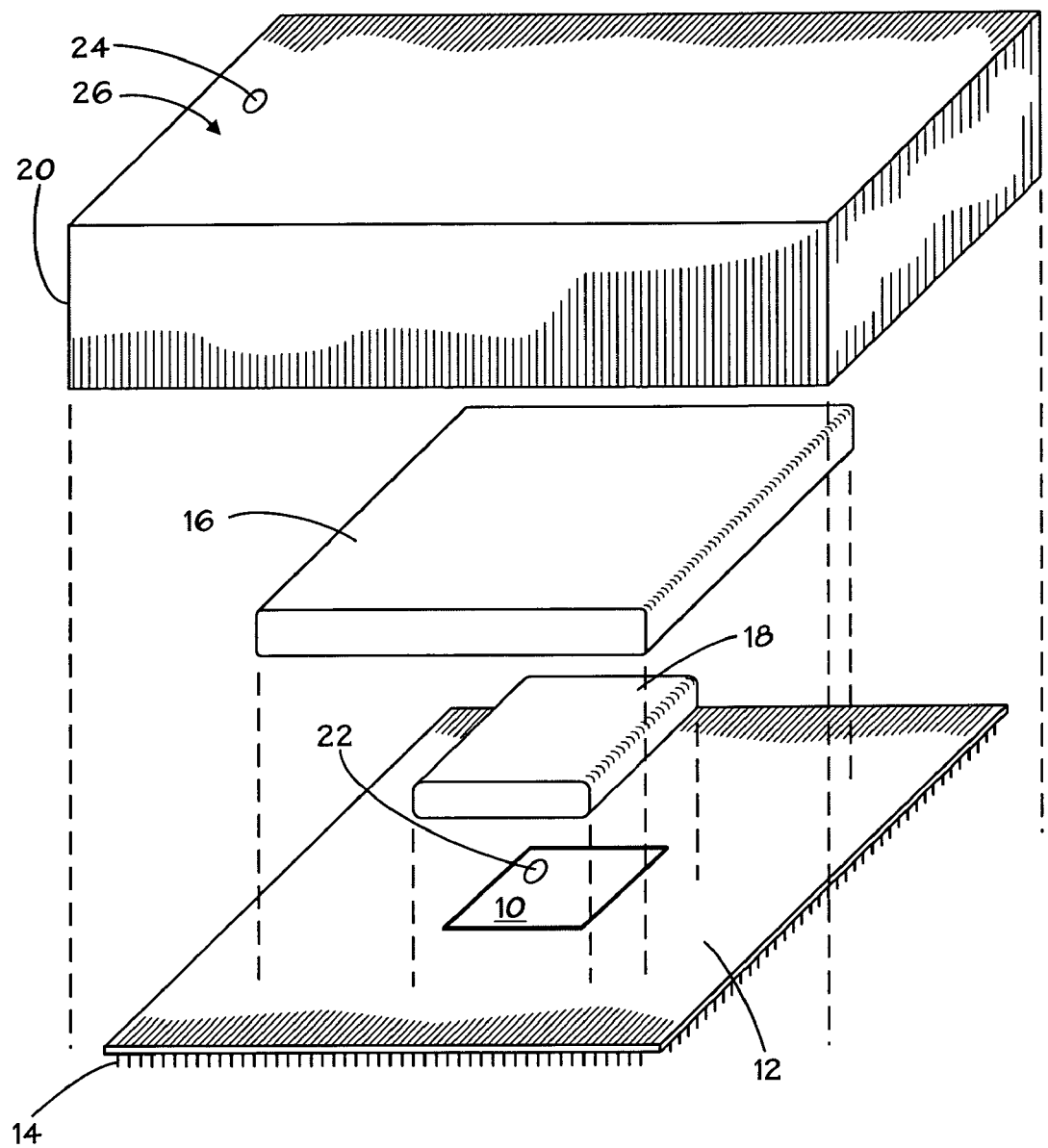
FIG. 1 is an exploded pictorial view of an exemplary conventional direct-mounted integrated circuit and heater.

In the drawings described below, reference numerals are generally repeated where identical elements appear in more than one figure. Turning now to the drawings, and in particular to FIG. 1, therein is shown an exploded pictorial view of an exemplary conventional integrated circuit die 10 that direct-mounted on a substrate 12. The substrate 12 includes a plurality of pins 14 which are designed to insert into corresponding sockets on a printed circuit border or other structure (not shown). A lid 16 is designed to be seated over and cover the integrated circuit 10. A thermal interface material 18 is normally positioned between the lid 16 and the integrated circuit 10 to facilitate the transfer of heat between the integrated circuit 10 and the lid 16. A thermal control device 20 is positioned on the lid 16. The thermal control system 20 is designed to maintain the integrated circuit at a selected temperature while the integrated circuit 10 is subjected to various forms of electrical and performance testing. In this regard, the thermal control system 20 is capable of both raising and lowering the temperature of the integrated circuit 10 as necessary. Although the thermal control system 20 is designed to provide both a cooling and heating function, such devices are frequently referred to in the industry as "heaters" or "thermal control units."

The integrated circuit 10 normally includes an onboard diode for temperature measurement, represented schematically in FIG. 1 by the oval 22. The thermal control system 20 is similarly provided with a temperature sensing diode 24 that is positioned on the upper side 26 of the thermal control system 20. As noted in the background section, the difficulty associated with the conventional design represented in FIG. 1 is that the thermal sensing diode 24 of the thermal control system 20, while operable to provide a measurement of the temperature at the top surface 26 of the thermal control system 20 does not provide an accurate measure of the temperature of the lid 16. The same is true for the thermal sensing diode 22 on board the integrated circuit 10. The diode 22 is simply not capable of providing an accurate measure of the temperature of the lid 16.

Figure 2:
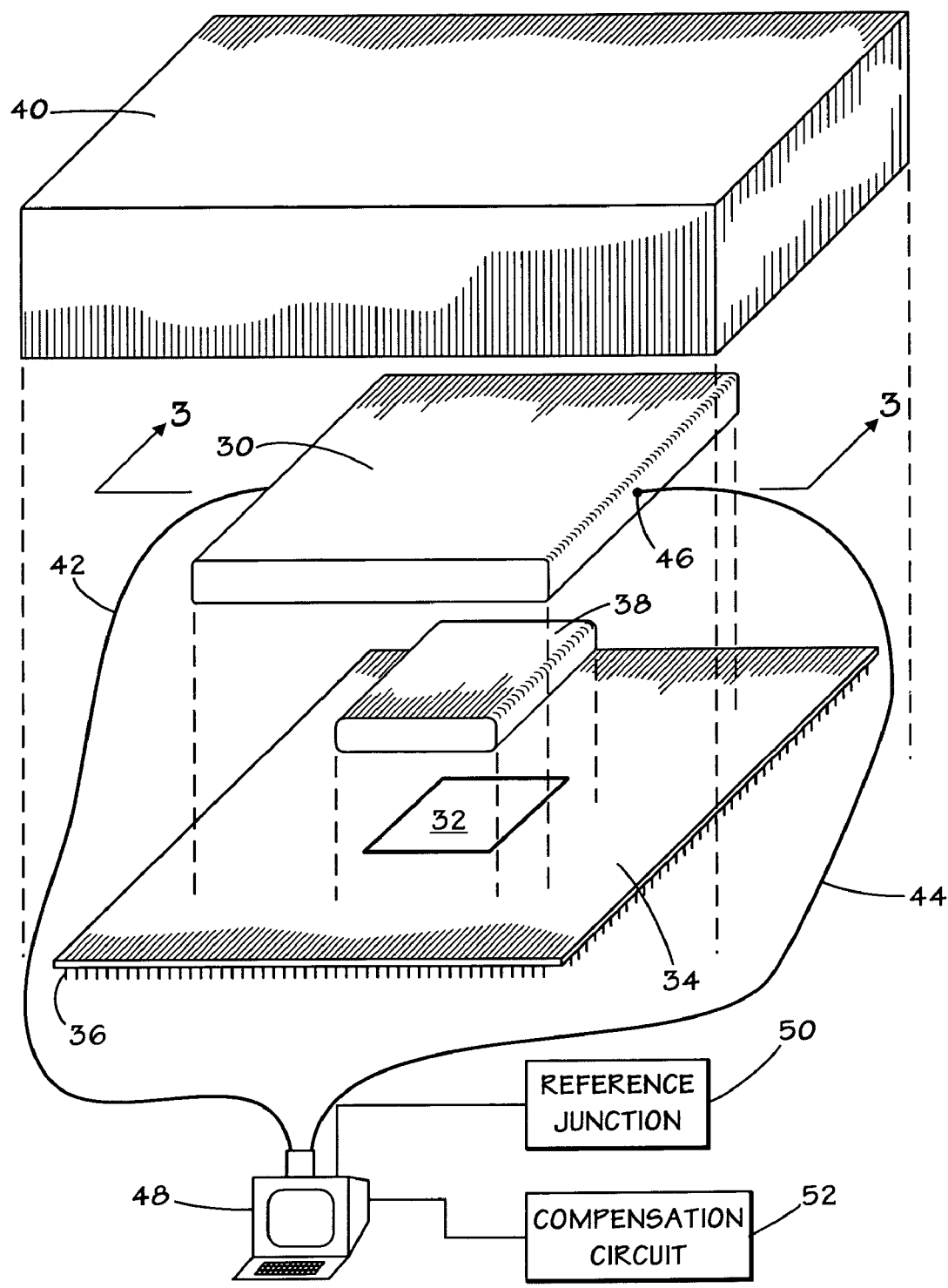
FIG. 2 is an exploded pictorial view of an exemplary embodiment of an apparatus or lid system capable of covering an electronic device and providing a measurement of the temperature of the lid in accordance with the present invention.

FIG. 2 is an exploded pictorial view of an exemplary embodiment of an apparatus or lid system 28 that includes a lid 30 that is capable of covering an electronic device 32 and providing an accurate measurement of the temperature of the lid 30. The lid 30 may partially or fully cover the electronic device 32 as desired. The electronic device 32 may be virtually any electronic device which may be fitted with a lid. It should be understood that the lid may be a discrete feature or part of an enclosure. In this illustrative embodiment, the electronic device 32 is an integrated circuit die. The integrated circuit 32 is mounted to a substrate 34 by direct mounting or other well-known techniques for positioning an integrated circuit on a substrate. The substrate 34 may be composed of well-known plastics, ceramics or other materials suitable for circuit substrates. The substrate 34 is provided with a plurality of conductor pins 36 that are designed to be inserted into respective sockets on a printed circuit board or other type of mounting device. A thermal interface material 38 is optionally positioned on the integrated circuit 32 beneath the lid 30. The thermal interface material 38 may be composed of a metal or metals such as indium, or well-known thermal pastes or plastic materials as desired. A thermal control system 40 is positioned on the lid 30 and functions as the thermal control system 20 described above in conjunction with FIG. 1.

Electrical leads 42 and 44 are connected to the lid 30. The point of connection between one of the leads, in this example lead 44, and the lid 30 establishes a dissimilar metal junction 46, which functions as a thermocouple. The other ends of the leads 42 and 44 are connected to a sensing instrument 48. The sensing instrument 48 is operable to receive the voltage output signal from the junction 46 and provide another output signal, such as a visual output that is indicative of the lid temperature. The sensing instrument 48 may be a voltage meter, a sensing instrument dedicated to thermocouple sensing, a computer or the like. In an exemplary embodiment, the sensing instrument may be a Wavetek model 23XT multimeter. The sensing instrument 48 may advantageously include a reference junction 50 and a compensation circuit 52. The reference junction 50 is advantageously a dissimilar metal junction of a type similar to the sensing junction 46. The reference junction 50 may be held at a known temperature. The compensation circuit 52 advantageously provides compensation for any differences in measurement caused by having the reference junction 50 at a temperature other than, for example, 0° C. Optionally, the reference junction 50 could be held at some fixed temperature, such as 0° C. The compensation circuit 52 may provide compensation without the need for a reference junction. In any event, the sensing instrument 48 is operable to sense the potential difference across the leads 42 and 44, which provides a measure of the temperature at the sensing junction 46 of the lid 30.

Figure 3:
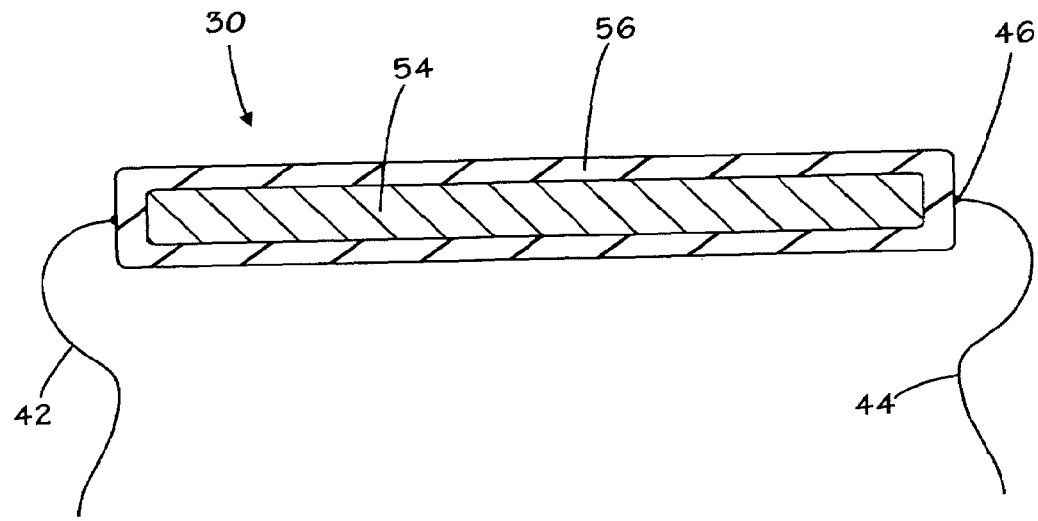
FIG. 3 is a cross-sectional view of the lid depicted in FIG. 2 taken at section 3-3 in accordance with the present invention.

Attention is now turned to FIG. 3, which is a cross-sectional view of the lid 30 depicted in FIG. 2 taken at section 3-3. In this illustrative embodiment, the lid 30 includes a central metallic core 54 surrounded by a metallic coating 56. The core 54 may be composed of a myriad of different metallic materials, such as, for example, copper, silver, gold, chrome, rhodium, aluminum, nickel, iron, platinum, alloys of these or the like. The coating 56 may be composed of the same types of materials. In this illustrative embodiment, the core 54 is composed of copper and the coating 56 is composed of nickel. The lead 44 is composed from a different metal than the coating 56 so that the dissimilar metal sensing junction 46 is established at the interface between the lead 44 and the coating 56. The materials for the lead 44 are selected to provide electrical conductivity and a dissimilar metal interface with the coating 56. Again, a variety of materials may be used, such as, for example copper, silver, gold, chrome, rhodium, aluminum, nickel, iron, platinum, alloys of these or the like. In this illustrative embodiment, the lead 44 is composed of a copper nickel alloy. The material selected for the lead 42 may or may not be dissimilar to the coating material 56, then the interface between the lead 42 and the coating could be used as a sensing junction as well. In this illustrative embodiment, the material selected for lead 42 is copper. The leads 42 and 44 are advantageously coupled to the lid 30 by way of welding, or via well-known fittings which hold the leads 42 and 44 in contact with the lid 30.

Of course, some standard material combinations may be used to establish the dissimilar metal sensing junction 46. The table below lists the two dissimilar metal combinations, the thermocouple type, the approximate maximum temperature range, and the temperature coefficient.

| Thermocouple Type | Dissimilar Metal Combination | Maximum Temp. (° C.) | Temperature Coefficient @20° C. (µV/° C.) |
|---|---|---|---|
| J | Iron Constantan (55% Cu-45% Ni) | 760 | 51.45 |
| K | Chromel (90% Ni-10% Cr) Alumel (96% Ni-2% Mn-2% Al) | 1370 | 40.28 |
| T | Copper Constantan (55% Cu-45% Ni) | 400 | 40.28 |

-continued

| Thermocouple Type | Dissimilar Metal Combination | Maximum Temp. (° C.) | Temperature Coefficient @20° C. (μV/° C.) |
|---|---|---|---|
| E | Chromel Constantan (55% Cu-45% Ni) | 1000 | 60.48 |
| S | Platinum 90% Pt-10% Rhodium | 1750 | 5.88 |
| R | Platinum 87% Pt-13% Rhodium | 1750 | 5.8 |
| B | 94% Pt-6% Rhodium 70% Pt-30% Rhodium | 1800 | 0 |

Figure 4:
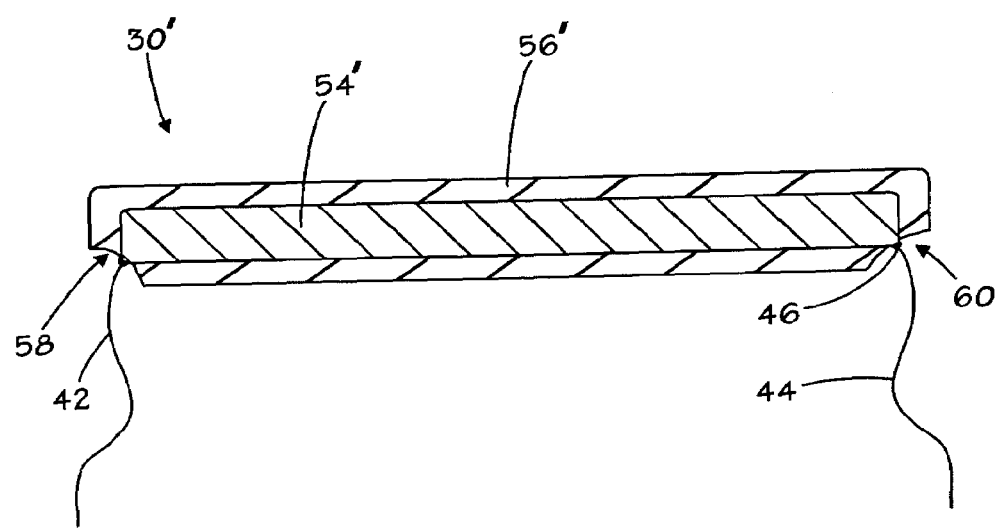
FIG. 4 is a cross-sectional view of an alternate exemplary embodiment of the lid depicted in FIG. 2 in accordance with the present invention.

An alternate exemplary embodiment of the lid 30' is illustrated in FIG. 4. In this illustrative embodiment, the core 54 and the coating 56 may be configured as generally described above in conjunction with FIG. 3. However, in this illustrative embodiment, the sensing junction 46 is established by making a physical connection between the lead 44 and a portion of the core 54'. This may be accomplished by removing portions of the coating 56' in the areas 58 and 60 so as to expose portions of the core 54'. Again, the lead 42 may be composed of copper and the lead 44 composed of a copper-nickel alloy. In this way, the sensing junction 46 consists of an interface between the copper core 54' and the dissimilar copper-nickel lead 44. The lead portions 58 and 60 of the coating 56 may be removed by any number of techniques, such as grinding, electrochemical machining, chemical etching or other well-known techniques. Optionally, the areas 58 and 60 may be formed without the need for material removal.

The illustrative embodiments of FIGS. 3 and 4 are intended to illustrate that the goal of providing a thermocouple with the lid 30 or 30' is achieved by having a dissimilar metal junction associated with the lid 30 or 30'. How that particular dissimilar metal junction is achieved is subject to great variety.

Referring again to FIG. 2, when fully assembled, the thermal interface material 38, the lid 30 and the thermal control system 40 form a stack on top of the integrated circuit 32. With the system assembled, the integrated circuit 32 may be subjected to electrical and/or other performance testing and the temperature of the lid 30 monitored during that testing using the sensing junction 46 and the sensing instrument 48. It should be understood that the thermal control system 40 and the integrated circuit may be outfitted with onboard thermal sensing diodes of the type depicted in FIG. 1 so that the temperatures of the thermal control system 40 and the integrated circuit 32 may be monitored in conjunction with the monitoring of the temperature of the lid 30.

In the foregoing illustrative embodiment, the incorporation of a thermal couple into the lid 30 is used in a testing context where the thermal control system 40 is positioned on the lid 30 and used to maintain the temperature of the integrated circuit 32 within some selected range. However, the lid 30 with an onboard thermocouple may be used in other than a testing context.

Figure 5:
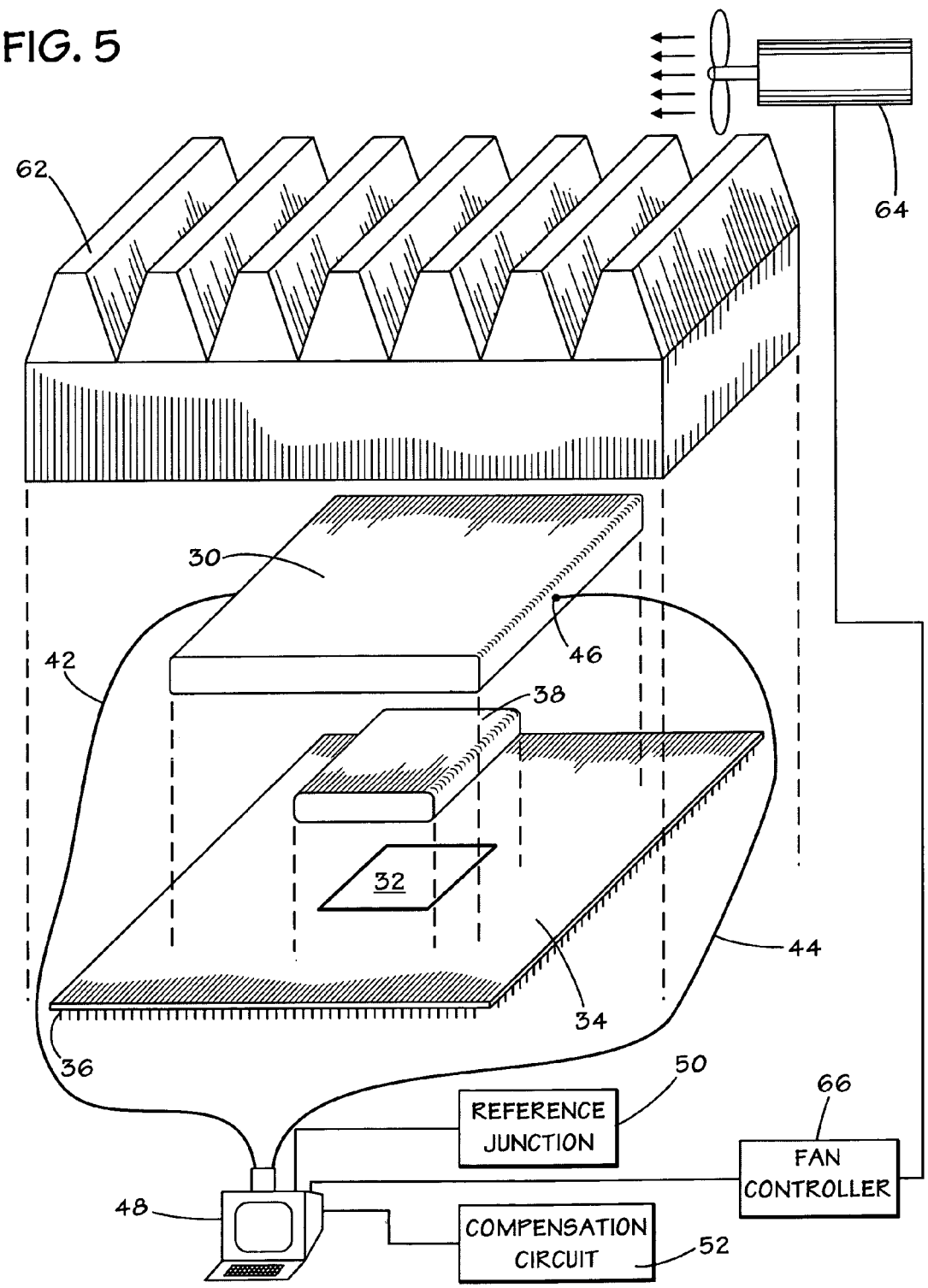
FIG. 5 is an exploded pictorial view of an alternate exemplary embodiment of an apparatus or lid system capable of covering an electronic device and providing a measurement of the temperature of the lid in accordance with the present invention.

Attention is now turned to FIG. 5, which is an exploded pictorial view like FIG. 2 but in this embodiment a heat sink 62 is substituted for the thermal control system 40 in the embodiment depicted in FIG. 2. Like the embodiment of FIG. 2, the integrated circuit 32 is mounted on the substrate 34 and thermal interface material 38 is sandwiched between the lid 30 and the integrated circuit 32. As with the other embodiment, the leads 42 and 44 are coupled to the lid and to the sensing instrument 48. The dissimilar metal sensing junction 46 is provided to create a voltage signal that is picked up by the sensing instrument 48. When fully assembled, the lid 30 is seated on the thermal interface material 38 and the heat sink 62 is seated on the lid 30. This type of arrangement may be used in, for example, a computer or other electronic system where a heat sink may be used to advantage on an integrated circuit for thermal management. The heat sink 62 may be composed of a variety of materials, such as, for example, aluminum, copper, silver, gold, chrome, rhodium, nickel, iron, platinum, alloys of these or the like. The sensing instrument 48 may be provided with a reference junction 50 and a compensation circuit 52 as described elsewhere herein.

An optional cooling fan 64 may be used to force a gas, such as air, past the heat sink 62. The fan 64 may be controlled by an optional fan controller 66. The fan controller 66 can receive an output signal from the sensing instrument 48 indicative of the temperature of the lid 30. The fan controller 66 can in-turn vary the speed of the fan 64 as necessary depending on the value of the output signal from the sensing instrument. The sensing instrument 48, the reference junction 50, the compensation circuit 52 and the fan controller 66 may all be discrete components or integrated into a single device or integrated circuit as desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   an electronic device;
   a lid for positioning on the electronic device; and
   a junction of two dissimilar metals associated with the lid wherein a portion of the lid provides one of the two dissimilar metals, the junction providing a thermocouple to provide an output signal representative of a temperature of the lid.

2. The apparatus of claim 1, comprising a sensing instrument to receive the output signal from the thermocouple.

3. The apparatus of claim 1, comprising a thermal interface material positioned between the lid and the electronic device.

4. The apparatus of claim 1, wherein the lid fully covers the electronic device.

5. The apparatus of claim 1, comprising a thermal control system positionable on the lid for controlling the temperature of the lid.

6. The apparatus of claim 1, wherein the lid comprises a metallic core and metallic coating surrounding the metallic core.

7. The apparatus of claim 6, wherein the junction comprises the metallic coating and a dissimilar metallic lead coupled to the metallic coating.

8. The apparatus of claim 6, wherein the junction comprises a portion of the metallic core and a dissimilar metallic lead coupled to the portion of the metallic core.

9. An apparatus, comprising:
   an integrated circuit;
   a lid for positioning on the integrated circuit; and
   a junction of two dissimilar metals associated with the lid wherein a portion of the lid provides one of the two dissimilar metals, the junction providing a thermocouple to provide an output signal representative of a temperature of the lid.

10. The apparatus of claim 9, comprising a sensing instrument to receive the output signal from the thermocouple.

11. The apparatus of claim 9, comprising a thermal interface material positioned between the lid and the integrated circuit.

12. The apparatus of claim 9, wherein the lid fully covers the integrated circuit.

13. The apparatus of claim 9, comprising a thermal control system positionable on the lid for controlling the temperature of the lid.

14. The apparatus of claim 9, wherein the lid comprises a metallic core and metallic coating surrounding the metallic core.

15. The apparatus of claim 14, wherein the junction comprises the metallic coating and a dissimilar metallic lead coupled to the metallic coating.

16. The apparatus of claim 14, wherein the junction comprises a portion of the metallic core and a dissimilar metallic lead coupled to the portion of the metallic core.

17. An apparatus, comprising:
a lid for an integrated circuit; and
a junction of two dissimilar metals associated with the lid wherein a portion of the lid provides one of the two dissimilar metals, the junction providing a thermocouple to provide an output signal representative of a temperature of the lid.

18. The apparatus of claim 17, comprising a sensing instrument to receive the output signal from the thermocouple.

19. The apparatus of claim 17, comprising a thermal interface material adapted to be positioned between the lid and the integrated circuit.

20. The apparatus of claim 17, wherein the lid fully covers the integrated circuit.

21. The apparatus of claim 17, comprising a thermal control system positionable on the lid for controlling the temperature of the lid.

22. The apparatus of claim 17, wherein the lid comprises a metallic core and metallic coating surrounding the metallic core.

23. The apparatus of claim 22, wherein the junction comprises the metallic coating and a dissimilar metallic lead coupled to the metallic coating.

24. The apparatus of claim 22, wherein the junction comprises a portion of the metallic core and a dissimilar metallic lead coupled to the portion of the metallic core.

25. An apparatus, comprising:
an electronic device;
a lid for positioning on the electronic device;
a junction of two dissimilar metals associated with the lid wherein a portion of the lid provides one of the two dissimilar metals, the junction providing a thermocouple to provide an output signal representative of a temperature of the lid; and
a heat sink coupled to the lid.

26. The apparatus of claim 25, comprising a sensing instrument to receive the output signal from the thermocouple.

27. The apparatus of claim 25, comprising a thermal interface material positioned between the lid and the electronic device.

28. The apparatus of claim 25, wherein the lid fully covers the electronic device.

29. The apparatus of claim 25, comprising a cooling fan for forcing a gas past the heat sink.

30. The apparatus of claim 25, wherein the lid comprises a metallic core and metallic coating surrounding the metallic core.

31. The apparatus of claim 30, wherein the junction comprises the metallic coating and a dissimilar metallic lead coupled to the metallic coating.

32. The apparatus of claim 30, wherein the junction comprises a portion of the metallic core and a dissimilar metallic lead coupled to the portion of the metallic core.

33. A method of sensing a temperature of an integrated circuit lid, comprising:
forming a junction of two dissimilar metals associated with the lid wherein a portion of the lid provides one of the two dissimilar metals, the junction providing a thermocouple operable to provide a first output signal indicative of the temperature of the lid; and
coupling the junction to a sensing instrument to receive the first output signal and generate a second output signal indicative of the temperature of the lid.

34. The method of claim 33, wherein the forming of the junction comprises coupling a dissimilar metal lead to the lid.

35. The method of claim 33, comprising operating the integrated circuit while measuring the temperature of the lid.

36. The method of claim 33, comprising coupling a heat sink to the lid.

* * * * *